United States Patent
Ja et al.

(10) Patent No.: US 7,302,659 B2
(45) Date of Patent: Nov. 27, 2007

(54) SYSTEM AND METHOD FOR UNFOLDING/REPLICATING LOGIC PATHS TO FACILITATE PROPAGATION DELAY MODELING

(75) Inventors: Yee Ja, Round Rock, TX (US); Bradley S. Nelson, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 11/054,903

(22) Filed: Feb. 10, 2005

(65) Prior Publication Data
US 2006/0190883 A1 Aug. 24, 2006

(51) Int. Cl.
*G06F 17/50* (2006.01)
*G06F 19/00* (2006.01)

(52) U.S. Cl. .................. 716/6; 716/7; 703/16

(58) Field of Classification Search .......... 716/7, 716/6; 703/16
See application file for complete search history.

(56) References Cited

U.S. PATENT DOCUMENTS

| | | | | |
|---|---|---|---|---|
| 4,011,465 A * | 3/1977 | Alvarez, Jr. | .................. | 327/141 |
| 5,287,289 A * | 2/1994 | Kageyama et al. | ............ | 716/18 |
| 5,396,435 A * | 3/1995 | Ginetti | .......................... | 716/6 |
| 5,452,239 A | 9/1995 | Dai et al. | | |
| 5,499,192 A * | 3/1996 | Knapp et al. | .................. | 716/17 |
| 5,504,690 A * | 4/1996 | Kageyama et al. | ............ | 716/2 |
| 5,586,047 A * | 12/1996 | Imahashi | ..................... | 716/18 |
| 5,659,484 A * | 8/1997 | Bennett et al. | ................ | 716/16 |
| 5,958,077 A | 9/1999 | Banerjee et al. | | |
| 5,966,523 A * | 10/1999 | Uchino | .......................... | 703/2 |
| 6,071,003 A | 6/2000 | Ashuri et al. | | |
| 6,321,184 B1 | 11/2001 | Baumgartner et al. | | |
| 6,374,393 B1 * | 4/2002 | Hirairi | ............................ | 716/8 |
| 6,516,449 B2 * | 2/2003 | Masud | .......................... | 716/3 |
| 6,553,514 B1 * | 4/2003 | Baumgartner et al. | ........ | 714/32 |
| 6,643,829 B1 | 11/2003 | Borkovic et al. | | |
| 6,643,832 B1 * | 11/2003 | Ray et al. | ....................... | 716/6 |
| 6,816,825 B1 * | 11/2004 | Ashar et al. | .................. | 703/14 |

(Continued)

OTHER PUBLICATIONS

Xie et al., "Design of Robust-Path-Delay-Fault-Testable Combinational Circuits by Boolean Expansion", IEEE 1992 International Conference on Computer Design: VLSI in Computers and Processors, Oct. 11-14, 1992, pp. 482-485.*

(Continued)

*Primary Examiner*—Phallaka Kik
(74) *Attorney, Agent, or Firm*—Stephen R. Tkacs; Stephen J. Walder, Jr.; Casimer K. Salys

(57) ABSTRACT

A system and method for unfolding/replicating logic paths to facilitate propagation delay modeling are provided. With the system and method, nets of an integrated circuit design are unfolded and logic of these nets is replicated such that each leg of a fanout can be driven independently from the signal source. In order to unfold the nets, the nets and logic are replicated in the netlist and connected to replicated source and endpoints. These new nets in the netlist may then be driven separately such that a different propagation delay along different nets from the same source may be simulated. In this way, a level of propagation delay may be abstracted into the modeling by driving or delaying each path separately. The transitioning value will then appear to have differing arrival times from the perspective of the sinks.

20 Claims, 5 Drawing Sheets

U.S. PATENT DOCUMENTS

| | | | |
|---|---|---|---|
| 6,868,535 B1 * | 3/2005 | Podkolzin et al. | 716/18 |
| 6,959,271 B1 * | 10/2005 | Ballam | 703/14 |
| 6,973,632 B1 * | 12/2005 | Brahme et al. | 716/6 |
| 7,020,589 B1 * | 3/2006 | Datta Ray et al. | 703/2 |
| 7,086,016 B2 * | 8/2006 | Matsuzaki et al. | 716/3 |
| 2001/0020289 A1 * | 9/2001 | Pavisic et al. | 716/1 |
| 2004/0103387 A1 * | 5/2004 | Teig et al. | 716/13 |
| 2004/0233742 A1 | 11/2004 | Morzano | |
| 2004/0250226 A1 * | 12/2004 | Lin et al. | 716/7 |
| 2005/0246673 A1 | 11/2005 | Charlebois et al. | |
| 2005/0273748 A1 * | 12/2005 | Hetzel et al. | 716/14 |
| 2006/0095879 A1 * | 5/2006 | Brahme et al. | 716/6 |
| 2006/0190860 A1 * | 8/2006 | Ng et al. | 716/4 |
| 2007/0033551 A1 * | 2/2007 | Greaves et al. | 716/3 |

OTHER PUBLICATIONS

Miyamoto et al., "An Efficient Algorithm for Deriving Logic Functions of Asynchronous Circuits", Proceedings of Second International Symposium on Advanced Research in Asynchronous Circuits and Systems, Mar. 18-21, 1996, pp. 30-35.*

Gharaybeh et al., "False-Path Removal Using Delay Fault Simulation", Proceedings of Seventh Asian Test Symposium, Dec. 2-4, 1998, pp. 82-87.*

U.S. Appl. No. 11/360,906, filed Feb. 23, 2006, Hidvegi et al.

U.S. Appl. No. 11/457,865, filed Jul. 17, 2006, Gass et al.

* cited by examiner

FIG. 7A

```
For each path
{
  if(new endpoint net exists == false)
  {
    create new endpoint net
    tag newly created net with the endpoint information and original net id
  } create new start point net
  tag newly created net with the endpoint information, original net id, and first gate for each gate in the path
  {
    if(replicated gate exists == false)
    {
      replicate gate
      tag each newly created gate with the endpoint information and original net id
    } for each output of the original gate
    {
      for each sink of the output
      {
        if(sink == the endpoint)
          connect replicated gate with the new endpoint net if(replicated sink gate for this path exists)
        {
          if(replicated output net for this path exists)
            connect output of replicated gate with this net
          else
          {
            replicate output net of original gate
            tag each newly created net with the endpoint information and original net id
            connect output of replicated gate with this net
            connect input of replicated sink gate with this net
          }
        }
      }
    }
  }
}
```

TO FIG. 7B

FROM FIG. 7A

```
for each input of the original gate
{
  for each source of the input
  {
    if(source == the start point)
       connect replicated gate with the new start point net if(replicated source gate for this path exists)
    {
      if(replicated input net for this path exists)
         connect input of replicated gate with this net
      else
      {
      replicate input net of original gate
      tag each newly created net with the endpoint information and original net id
      connect input of replicated gate with this net
      connect output of replicated source gate with this net
      }
    }
      else
         connect original source to this input
  }
 }
}
For each path
{
   connect endpoints with new endpoint nets
   connect new start points with start point drivers
}
```

*FIG. 7B*

SYSTEM AND METHOD FOR UNFOLDING/REPLICATING LOGIC PATHS TO FACILITATE PROPAGATION DELAY MODELING

BACKGROUND OF THE INVENTION

1. Technical Field

The present invention relates generally to an improved data processing system and method. More specifically, the present invention provides a system and method for unfolding/replicating logic paths to facilitate propagation delay modeling.

2. Description of Related Art

Logic simulation is often utilized during integrated circuit design in order to simulate the operation of the integrated circuit to perform logic verification. For example, logic simulation may be used to identify the expected operation of the integrated circuit when fabricated, identify potential problems in the integrated circuit design, areas where the integrated circuit design may be optimized, and the like. Typically in logic simulation, when a signal originates from a single source and fans out to multiple sinks (or the same sink following an initial fanout), the value of this signal is uniform for each fanout. That is, every leg out of the source of the signal is considered to be identical thereby resulting in the same signal value. However, this is often not the case in the actual circuit.

Propagation delay because of different wire lengths or combinational gates through which the signal value must traverse, and other factors, all combine to make the propagation rate of a transitioning signal variable for each leg in which the signal fans out. This represents a real problem, especially in asynchronous logic verification. With asynchronous logic, two or more different clock domains are utilized. The asynchronous logic results in variations in propagation delay along different nets of the integrated circuit design. Thus, using a uniform approach to fanouts of logic in an integrated circuit design does not provide an adequate representation of the actual operation of the integrated circuit nets.

In view of the above, it would be beneficial to have a system and method for modeling fanouts of an integrated circuit design such that propagation delay along each net may be modeled.

SUMMARY OF THE INVENTION

The present invention provides a system and method for unfolding/replicating logic paths to facilitate propagation delay modeling. With the system and method of the present invention, nets of an integrated circuit design are unfolded and logic of these nets is replicated such that each leg of a fanout can be driven independently from the signal source. In order to unfold the nets, the nets and logic are replicated in the netlist and connected to the replicated source and endpoints similar to the source and endpoints in the original logic. These new nets in the netlist may then be driven separately such that a different propagation delay along different nets from the same source may be simulated. In this way, a level of propagation delay may be abstracted into the modeling by driving or delaying each path separately. The transitioning value will then appear to have differing arrival times from the perspective of the sinks.

In operation, a new source net will be created for every path to be unfolded. The gates and nets (except the first net, connected to the start point) in a path are replicated for each unique end point, if not already replicated. If the replicated gate is the respective first gate in the path, then the newly created source net is connected to this replicated first gate accordingly. All the replicated gates and nets are connected in accordance with the original gates and nets, except that replicated nets are connected to the inputs and outputs of the replicated gate where possible. However, if a replicated net is not available for a gate input, then the gate input is connected to the original net. If a replicated net is not available for a gate output, then the gate output is left disconnected.

Once the replicated path is created, the end point is then disconnected from its original source net and connected with the respective replicated net. This end point can now be uniquely driven by the new start point. By replicating the gates and nets for each unique end point, it is possible for paths with a common end point to share replicated gates and nets. It is also possible for some connections (to non-replicated nets) of an already replicated gate to be replaced by replicated nets from subsequent/other replicated paths. It is also important to note that not all nets and gates in the cone of logic for an end point need be replicated. A net will only be replicated if it exists in a path to be unfolded.

In one exemplary operation of one possible implementation of the present invention, each path in an integrated circuit design that requires replication is identified and logged. Then for each path, a new endpoint net is generated, if it has not already been generated for a previous path. That is, since nets and logic in a particular path may be shared by other paths that are subject to replication, the endpoint for this path may have already been replicated when replicating a previous path. If so, then the already replicated endpoint is utilized during the replication process for this path. If not, then a new endpoint is generated in order to replicate this path.

A start point net is then generated. Thereafter, gates in the path are replicated. For each output of a replicated gate, if the sink of the original gate's output, i.e. the output of the gate that is being replicated, is the endpoint net for the original path, the replicated gate is connected to the new endpoint net. If a replicated sink gate for this path exists, i.e. has been generated during replication of another path, and if a replicated output net for this path exists, the output of the replicated gate is connected to the replicated output net. Otherwise, if a replicated sink gate for this path exists, and a replicated output net for this path does not exist, the output net of the original gate is replicated.

If the replicated sink gate for the path exists and a replicated output net for this path does not exist, then the replicated output net is tagged with lookup information, e.g., endpoint information and original net identification information. The output of each replicated gate is connected with this replicated output net and the input of the replicated sink gate is connected with this replicated output net.

Each newly created net is tagged with the endpoint information and the original net identification information. In this way, each replicated net is associated with an endpoint and the original net for which it is a replication. This association is used during a lookup of nets during the replication process to determine if a net already exists for the current replication process. Thus, for example, the "if" conditions described above that determine if a net already exists or not may be performed by using a lookup operation in a lookup table of replicated nets and gates, that may be indexed by endpoint and original net id information, to determine if a replicated net already exists.

Similarly, replicated gates are tagged, when created, with endpoint information and original gate identification information. This association may be made using the replicated net and gate lookup table described above, or a separate replicated gate lookup table, for example. The start point net generated by the process above is tagged with the endpoint information, original net identification information and a first gate identification. This first gate information is used to identify which gate the start point is to be connected to in the path.

A similar operation is performed for each input of the original gate that is being replicated. For each input of the original gate, and for each source of the input, if the source is the start point, the replicated gate is connected to the new start point net. For each input and source of the input, If a replicated source gate for this path already exists, i.e. from a previous replication process for example, and if a replicated input net for this path already exists, the input of the replicated gate is connected to the replicated input net. Otherwise, if a replicated input net for this path does not already exist, the input net of the original gate is replicated, each created net is tagged wit the endpoint information and original net identification information, the input of the replicated gate is connected with the replicated input net, and the output of the replicated source gate is connected with the replicated input net. If a replicated source gate for this path does not already exist, the original source is connected to the input of the replicated gate.

Thereafter, the endpoints are connected with the new endpoint nets, and the new start points are connected with the start point drivers. In this way, the original logic is unfolded by replicating nets and logic such that each net may be individually driven. These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 7A and 7B provide an example of pseudocode that may be used to implement one exemplary embodiment of the present invention.

DETAILED DESCRIPTION OF THE PREFERRED EMBODIMENT

The present invention provides a mechanism for unfolding/replicating logic paths to facilitate propagation delay modeling. The present invention is preferably implemented in conjunction with an integrated circuit design system used to design and verify the operation of an integrated circuit design. As such, the present invention is preferably implemented in a data processing system. The data processing system may be a stand alone data processing system or a distributed data processing system that may include one or more networks and one or more computing devices coupled to the one or more networks.

Figure 1:
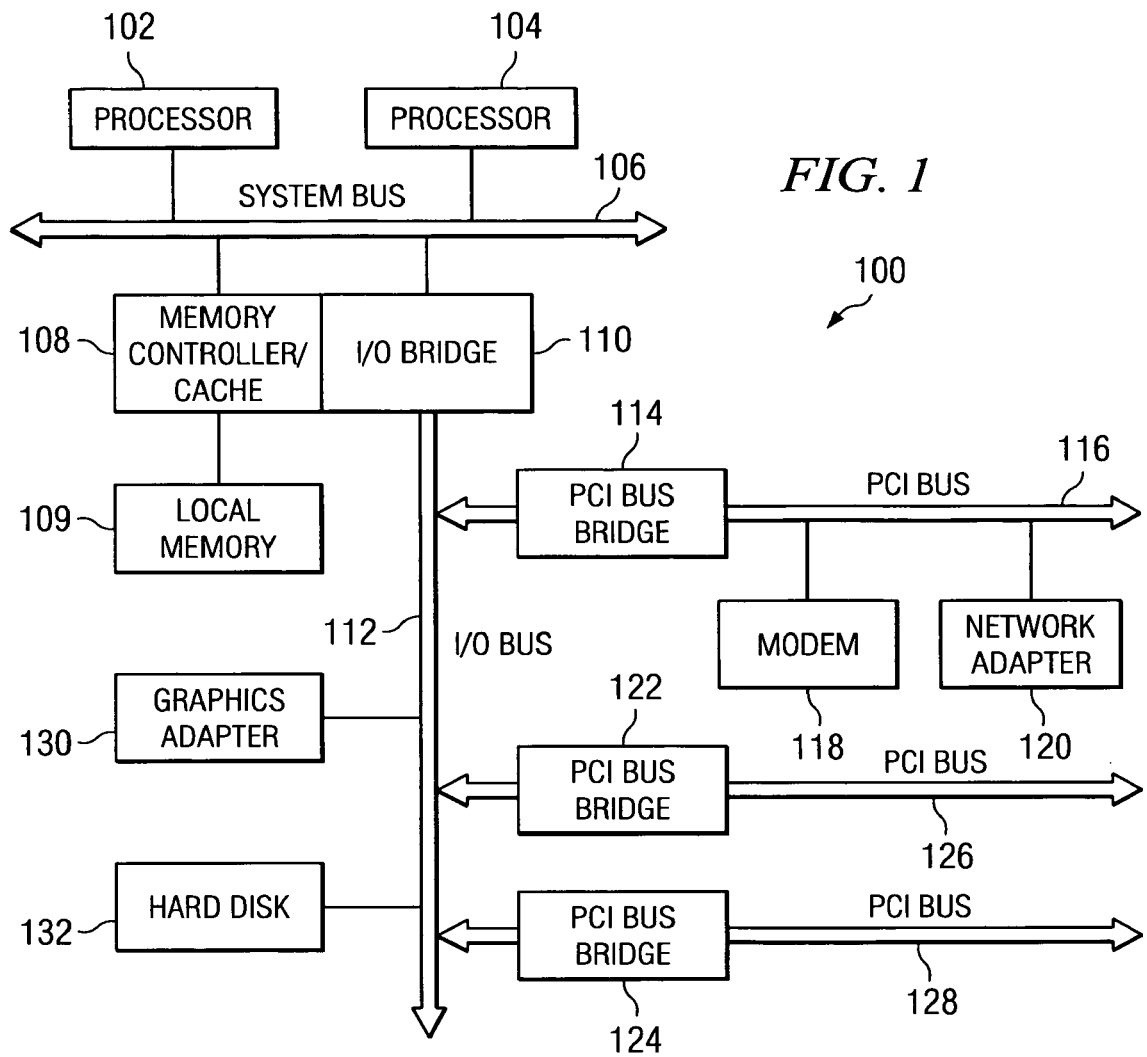
FIG. 1 is an exemplary block diagram illustrating an exemplary data processing system in which elements of the present invention may be implemented.

FIG. 1 is provided as one example of a data processing system in which aspects of the present invention may be implemented. However, it should be appreciated that FIG. 1 is only exemplary and is not intended to state or imply any limitation as to the particular types of data processing systems which may be used to implement the exemplary aspects of the present invention as described hereafter. Many modifications may be made to the data processing system depicted in FIG. 1 without departing from the spirit and scope of the present invention.

As shown in FIG. 1, the data processing system 100 may be a symmetric multiprocessor (SMP) system including a plurality of processors 102 and 104 connected to system bus 106. Alternatively, a single processor system may be employed. The data processing system 100 may be, for example, a stand alone computing device or a server computing device that communicates with one or more client computing devices. For purposes of the present description, it will be assumed that the data processing system 100 is a server computing device.

Connected to system bus 106 is memory controller/cache 108, which provides an interface to local memory 109. I/O Bus Bridge 110 is connected to system bus 106 and provides an interface to I/O bus 112. Memory controller/cache 108 and I/O Bus Bridge 110 may be integrated as depicted.

Peripheral component interconnect (PCI) bus bridge 114 connected to I/O bus 112 provides an interface to PCI local bus 116. A number of modems may be connected to PC local bus 116. Typical PCI bus implementations will support four PCI expansion slots or add-in connectors. Communications links to client computing devices may be provided through modem 118 and network adapter 120 connected to PCI local bus 116 through add-in connectors.

Additional PCI bus bridges 122 and 124 provide interfaces for additional PCI local buses 126 and 128, from which additional modems or network adapters may be supported. In this manner, data processing system 100 allows connections to multiple network computers. A memory-mapped graphics adapter 130 and hard disk 132 may also be connected to I/O bus 112 as depicted, either directly or indirectly.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 1 may be, for example, an IBM eServer pseries system, a product of International Business Machines Corporation in Armonk, N.Y., running the Advanced Interactive Executive (AIX) operating system or LINUX operating system.

The present invention provides a mechanism which may be implemented using the data processing system depicted in FIG. 1, for example, to unfold/replicate logic paths in an integrated circuit design to facilitate propagation delay modeling. That is, the propagation delay modeling provided by the mechanisms of the present invention are such that each duplicate source can and may contribute its transitioning value non-simultaneously to the logic evaluation of the sink value.

With the mechanism of the present invention, nets of an integrated circuit design are unfolded and logic of these nets is replicated such that each leg of a fanout can be driven independently from the signal source. In order to unfold the nets, the nets and logic are replicated in the netlist and connected to the same source and endpoints as the original net. These new nets in the netlist may then be driven separately such that a different propagation delay along different nets from the same source may be simulated. In this way, a level of propagation delay may be abstracted into the modeling by driving or delaying each path separately. The transitioning value will then appear to have differing arrival times from the perspective of the sinks.

It should be appreciated that while the present invention is described in terms of the logic in the nets being replicated, not all signals and gates in the cone of logic of a net being unfolded need to be replicated. For example, when unfolding an asynchronous path, only the asynchronous logic (nets and gates) need to be unfolded. The synchronous logic can be used as is, i.e. unreplicated. For purposes of the following explanation it is assumed that only those nets and logic that need replication are replicated by the present invention.

Figure 2A:
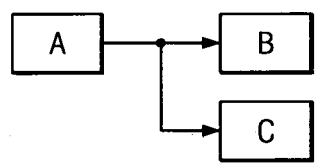
FIGS. 2A and 2B illustrate a simple unfolding example in accordance with an exemplary embodiment of the present invention.
Figure 2B:
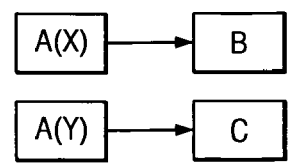

FIGS. 2A and 2B illustrate a simple unfolding example in accordance with an exemplary embodiment of the present invention. As shown in FIG. 2A a single source A drives two sinks or endpoints B and C. In a traditional simulation of this circuit, B and C will always have the same value. However, in reality, because of different factors including wire lengths, different logic on each leg, and the like, the values at B and C may be different due to propagation delays.

The present invention provides a mechanism for unfolding the circuit design shown in FIG. 2A into two separately driven nets as shown in FIG. 2B. As shown in FIG. 2B, each sink B and C is driven separately by sources A(x) and A(y), respectively. In so doing, sinks B and C do not have to be totally in sync with each other. Thus, when the source A transitions in value, it is possible to produce A' and A" such that they are both functions of A. A' is A delayed by an amount of time "x" and A" is A delayed by an amount of time "y." Hence, from the perspective of the sinks, there is the appearance of a propagation delay in the nets.

Figure 3A:
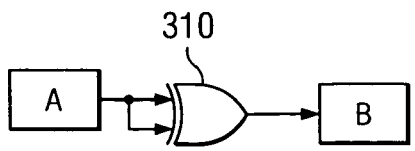
FIGS. 3A and 3B illustrate an example of unfolding a logical XOR gate having two inputs from a single source in accordance with an exemplary embodiment of the present invention.
Figure 3B:
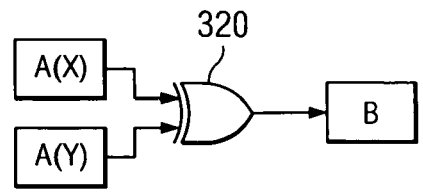

FIGS. 3A and 3B illustrate an example of unfolding a logical XOR gate having two inputs from a single source in accordance with an exemplary embodiment of the present invention. As shown in FIG. 3A, the inputs to XOR gate 310 are both driven by source A and the XOR gate provides an output to sink B. In a traditional logic simulation of this circuit, the sink B will never see a glitch-to-1, i.e. a temporary transition to a different value at one of the inputs due to a propagation delay thereby causing the output of the XOR gate to be a 1. However, a glitch-to-1 is a real possibility in the actual circuit.

With the present invention, the circuit shown in FIG. 3A may be unfolded such that the glitch-to-1 condition is made possible in the logic simulation. That is, through the mechanisms of the present invention, the XOR gate 310 shown in FIG. 3A is unfolded to generate the XOR gate 320 shown in FIG. 3B. As shown in FIG. 3B, the inputs to the XOR gate 320 are separately driven by sources A(x) and A(y) thereby permitting an independent delay in the transition of the value from sources A(x) and A(y). As a result, one input may transition faster than the other input causing a temporary glitch-to-1 condition to occur in the logic simulation.

Figure 4A:
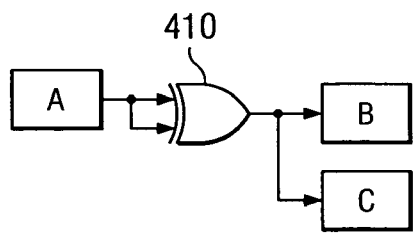
FIGS. 4A and 4B illustrate an example of unfolding a logical XOR gate having two inputs from a single source and two output lines that are to be driven, in accordance with an exemplary embodiment of the present invention.
Figure 4B:
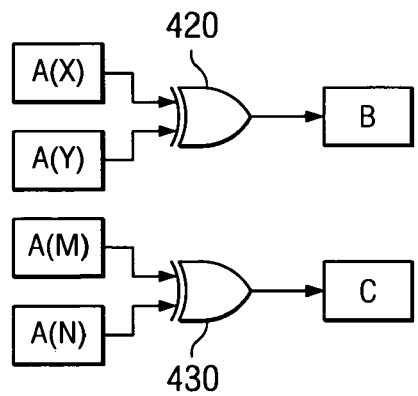

FIGS. 4A and 4B illustrate an example of unfolding a logical XOR gate having two inputs from a single source and two output lines that are to be driven, in accordance with an exemplary embodiment of the present invention. As shown in FIG. 4A, the XOR gate 410 is similar to the XOR gate 310 in the previous example except that the output of the XOR gate 410 drives two sinks B and C. Since the XOR gate 410 drives two sinks B and C, in addition to unfolding the nets from the source A to provide separately driven inputs to the XOR gate 410, the XOR gate 410 itself must be replicated so that it may separately drive each of the outputs B and C.

FIG. 4B illustrates the unfolded/replicated XOR gates 420 and 430 according to the present invention. As shown in FIG. 4B, the inputs to XOR gate 420 are driven by sources A(x) and A(y) and XOR gate 420 provides an output to sink B. The inputs to XOR gate 430 are driven by sources A(m) and A(n) and the XOR gate 430 provides an output to sink C. The x, y, m and n values are all potentially different delay amounts.

As can be seen from the examples depicted in FIGS. 2A-4B the number of times a source net should be unfolded is equal to the number of paths from the source to the sinks, i.e. the number of independently driven sources required. In addition, as can be seen from the above examples, the gates and intermediate nets are replicated for each sink. The present invention makes use of these observations to provide a mechanism for unfolding/replicating nets and gates of fanouts in an integrated circuit design such that each leg of the fanouts may be independently driven. In this way, each leg may be simulated with a different delay value making the simulation more accurate to the way in which the actual circuit may operate.

Essentially, the paths in the integrated circuit design are analyzed to identify the paths which require unfolding/replicating using the mechanisms of the present invention. For example, the paths may be analyzed to determine which paths have sources that drive more than one net. As a further example, asynchronous interface paths may be identified by analyzing paths in the integrated circuit design such that these asynchronous interface paths may be subjected to unfolding/replicating in accordance with the exemplary embodiments of the present invention. These identified paths are logged for processing by the mechanism of the present invention. In logging these paths, the start point of the path is the output pin of a gate/latch/array and the end point is the input pin of a gate/latch/array with all gates in the path being logged.

Each logged path is then processed to replicate the path in the netlist for each source with gates in the path that drive more than one sink being replicated as well. Thus, by operation of the present invention, the netlist for the integrated circuit design is expanded to include these replicated paths which may be used to model propagation delay.

In operation, a new source net will be created for every path to be unfolded. The gates and nets (except the first net, connected to the start point) in a path are replicated for each unique end point, if not already replicated. If the replicated gate is the respective first gate in the path, then the newly created source net is connected to this replicated first gate accordingly. All the replicated gates and nets are connected in accordance with the original gates and nets, except that replicated nets are connected to the inputs and outputs of a gate where possible. However, if a replicated net is not available for a gate input, then the gate input is connected to the original net. If a replicated net is not available for a gate output, then the gate output is left disconnected.

Once the replicated path is created, the end point is then disconnected from its original source net and connected with the respective replicated net. This end point can now be uniquely driven by the new start point. By replicating the gates and nets for each unique end point, it is possible for paths with a common end point to share replicated gates and nets. It is also possible for some connections (to non-replicated nets) of an already replicated gate to be replaced by replicated nets from subsequent/other replicated paths. It is also important to note that not all nets in the cone of logic for an end point need be replicated. A net will only be replicated if it exists in a path to be unfolded.

In one exemplary operation of one possible implementation of the present invention, each path in an integrated circuit design that requires replication is identified and logged. Then for each path, a new endpoint net is generated, if it has not already been generated for a previous path. That is, since nets and logic in a particular path may be shared by other paths that are subject to replication, the endpoint for this path may have already been replicated when replicating a previous path. If so, then the already replicated endpoint is utilized during the replication process for this path. If not, then a new endpoint is generated in order to replicate this path.

A start point net is then generated. Thereafter, gates in the path are replicated. For each output of a replicated gate, if the sink of the original gate's output, i.e. the output of the gate that is being replicated, is the endpoint net for the original path, the replicated gate is connected to the new endpoint net. If a replicated sink gate for this path exists, i.e. has been generated during replication of another path, and if a replicated output net for this path exists, the output of the replicated gate is connected to the replicated output net. Otherwise, if a replicated sink gate for this path exists, and a replicated output net for this path does not exist, the output net of the original gate is replicated.

If the replicated sink gate for the path exists and a replicated output net for this path does not exist, then the replicated output net is tagged with lookup information, e.g., endpoint information and original net identification information. The output of each replicated gate is connected with this replicated output net and the input of the replicated sink gate is connected with this replicated output net.

Each newly created net is tagged with the endpoint information and the original net identification information. In this way, each replicated net is associated with an endpoint and the original net for which it is a replication. This association is used during a lookup of nets during the replication process to determine if a net already exists for the current replication process. Thus, for example, the "if" conditions described above that determine if a net already exists or not may be performed by using a lookup operation in a lookup table of replicated nets and gates, that may be indexed by endpoint and original net id information, to determine if a replicated net already exists.

Similarly, replicated gates are tagged, when created, with endpoint information and original gate identification information. This association may be made using the replicated net and gate lookup table described above, or a separate replicated gate lookup table, for example. The start point net generated by the process above is tagged with the endpoint information, original net identification information and a first gate identification. This first gate information is used to identify which gate the start point is to be connected to in the path.

A similar operation is performed for each input of the original gate that is being replicated. For each input of the original gate, and for each source of the input, if the source is the start point, the replicated gate is connected to the new start point net. For each input and source of the input, If a replicated source gate for this path already exists, i.e. from a previous replication process for example, and if a replicated input net for this path already exists, the input of the replicated gate is connected to the replicated input net. Otherwise, if a replicated input net for this path does not already exist, the input net of the original gate is replicated, each created net is tagged wit the endpoint information and original net identification information, the input of the replicated gate is connected with the replicated input net, and the output of the replicated source gate is connected with the replicated input net. If a replicated source gate for this path does not already exist, the original source is connected to the input of the replicated gate.

Thereafter, the endpoints are connected with the new endpoint nets and the new start points are connected with the start point drivers. In this way, the original logic is unfolded by replicating nets and logic such that each net may be individually driven.

Figure 5:
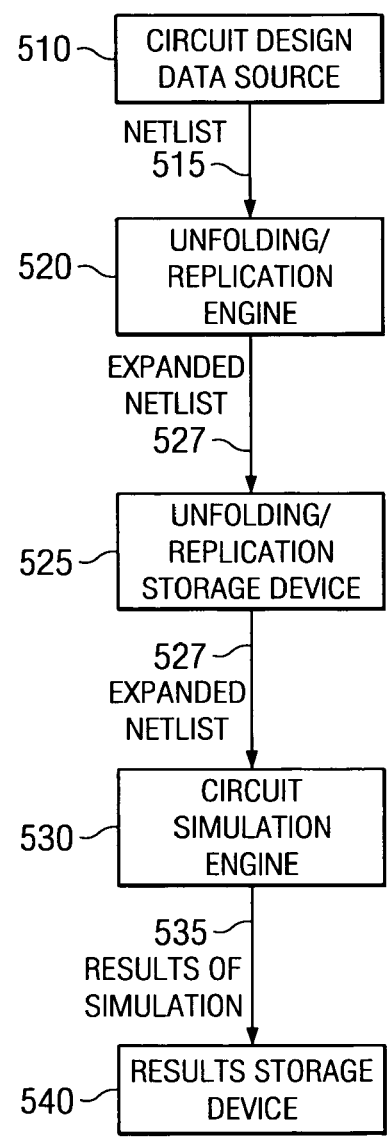
FIG. 5 is an exemplary block diagram illustrating the primary operational components of one exemplary embodiment of the present invention.

FIG. 5 is an exemplary block diagram illustrating the primary operational components of one exemplary embodiment of the present invention. As shown in FIG. 5, the primary operation components of the present invention include an integrated circuit design data source 510, an unfolding/replication engine 520, a circuit simulation engine 530, and a results storage device 540. These elements 510-540 may be part of, for example, an integrated circuit design system, many examples of which are generally known in the art.

The integrated circuit design data source 510 provides an initial netlist 515 to the unfolding/replication engine 520. The unfolding/replication engine 520 identifies those nets in the netlist 515 that require replication and the corresponding gates in the netlist 515 that require replication in the netlist. These nets, or paths, are logged in unfolding/replication storage device 525.

For those nets logged in the unfolding/replication storage device 525, the unfolding/replication engine 520 unfolds the nets and replicates the identified gates such that the sinks of the nets may be separately driven by replicated nets and sources. In this way, each replication of the source and nets may be driven separately so that different types of propagation delay may be simulated on each net. The additional nets generated by this unfolding/replication operation are added to the original netlist 515 to generate the expanded netlist 527.

The expanded netlist 527 is provided to the circuit simulation engine 530 which simulates the operation of the integrated circuit design using the information from the expanded netlist 527 as well as other inputs (not shown). The results 535 of the circuit simulation are then output to the results storage device 540 for use by a user of the integrated circuit design system, optimization tools, or the like.

Figure 6:
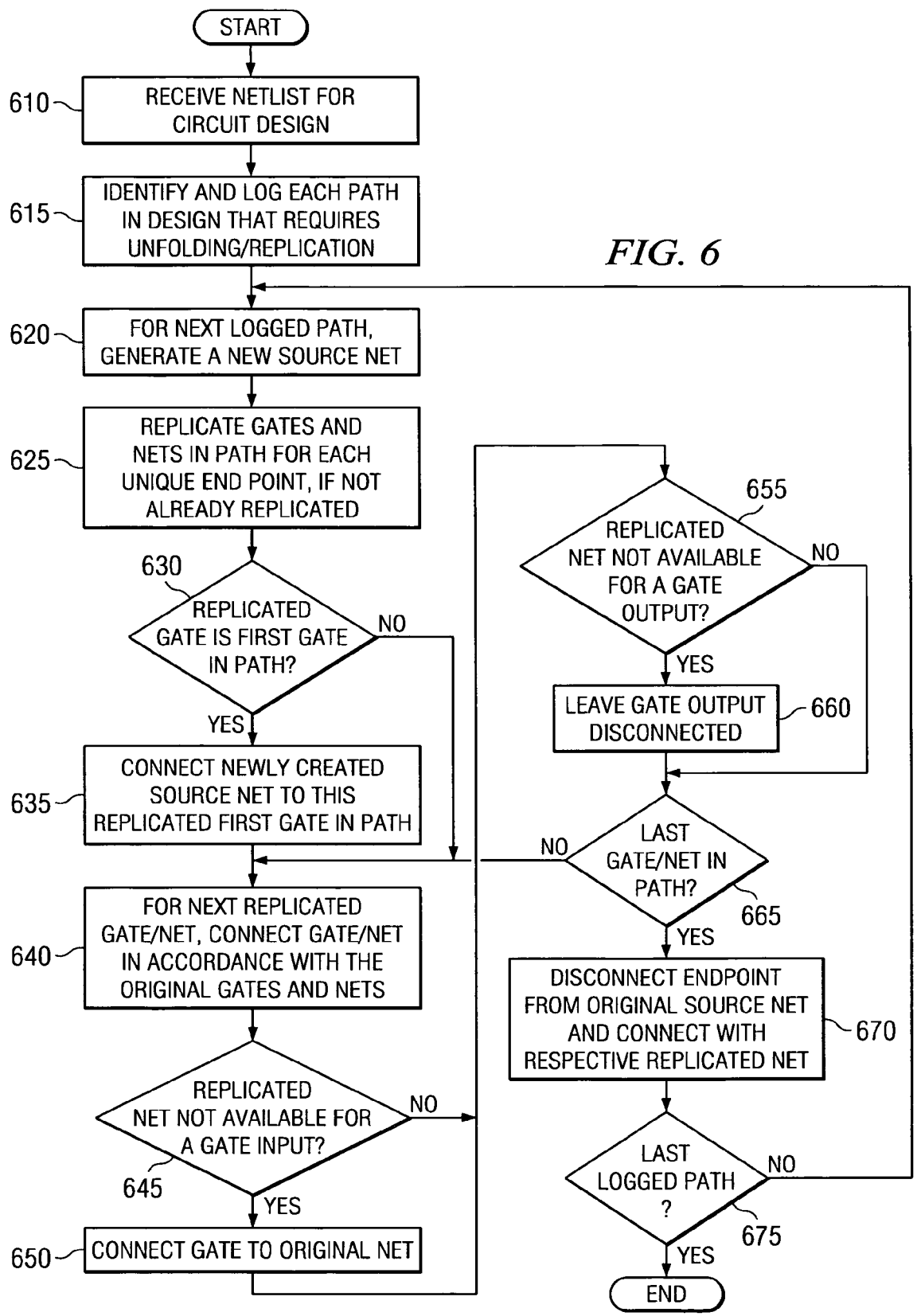
FIG. 6 is a flowchart outlining an exemplary operation of the present invention.

FIG. 6 is a flowchart outlining an exemplary operation of the present invention. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 6, the operation starts by receiving a netlist for the integrated circuit design (step 610). Each path in an integrated circuit design that requires replication is identified and logged (step 615). These paths may be, for example, paths that include the same source driving a plurality of sinks, asynchronous crossings, or the like. Then, for the next logged path, which is a first logged path during the first iteration of the present invention, a new source net is created (step 620). The gates and nets (except the first net, connected to the start point) in a path are replicated for each unique end point, if not already replicated (step 625). If the replicated gate is the respective first gate in the path (step 630), then the newly created source net is connected to this replicated first gate accordingly (step 635).

All the replicated gates and nets are connected in accordance with the original gates and nets, except that replicated nets are connected to the inputs and outputs of a gate where possible (step 640). However, if a replicated net is not available for a gate input (step 645), then the gate input is connected to the original net (step 650). If a replicated net is not available for a gate output (step 655), then the gate output is left disconnected (step 660).

A determination is then made as to whether this is the last replicated gate/net in the replicated path (step 665). If not, the operation returns to step 640. If this is the last replicated gate/net in the replicated path, the endpoint is disconnected from the original source net and connected with the respective replicated net of this path (step 670). This end point can now be uniquely driven by the new start point.

A determination is then made as to whether this is the last logged path (step 675). If not, the operation returns to step 620. If this is the last logged path, the operation terminates.

FIGS. 7A and 7B provide an example of pseudocode that may be used to implement one exemplary embodiment of the present invention. The pseudocode shown in FIGS. 7A and 7B corresponds to the operations shown in FIG. 6 above. It should be appreciated that the pseudocode in FIGS. 7A and 7B is only one example implementation of the present invention and many modifications to the pseudocode may be made without departing from the spirit and scope of the present invention.

The psuedocode shown in FIGS. 7A and 7B provides for the creation of a new source net for each path that is to be replicated, replication of gates and nets of each path that is to be replicated, and then connecting the gates and nets in accordance with the original gates and nets in the path where possible. For those inputs and outputs of a gate that do not have an available replicated net, either the gate is connected to the original net (in the case of gate inputs) or are left disconnected (in the case of gate outputs). In addition, if the gate is a first gate in the path, then it is connected to the newly created source net for this replicated path. After all the replicated gates and nets of a replicated path are connected, the endpoint is disconnected from the original source net and is connected to the replicated net.

Thus, with the present invention, a mechanism is provided for unfolding/replicating paths in an integrated circuit design. This unfolding/replicating permits different delays to be modeled for the paths such that propagation delay modeling is permitted. As a result, a more accurate representation of the actual operation of the integrated circuit design, especially with regard to asynchronous crossovers and fanouts, is made possible.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for modeling an operation of an integrated circuit design, comprising:
   receiving data representing the integrated circuit design;
   identifying an original path in the integrated circuit design requiring unfolding, wherein the original path starts at a source and ends at two or more sinks;
   unfolding the original path such that one or more new nets are provided, wherein each of the one or more new nets is driven from a differently delayed source from that of the original path; and
   modeling an operation of the integrated circuit design using the original net and the one or more new nets in the path such that each of the original path and the one or more new nets provides a different propagation delay at the two or more sinks and a transitioning value has differing arrival times at the two or more sinks.

2. The method of claim 1, further comprising:
    determining if a logic gate in the original path requires replication; and
    replicating the logic gate if the logic gate needs to be replicated.

3. The method of claim 1, wherein the one or more new nets are added to a netlist for the integrated circuit design and wherein the one or more new nets are connected to one or more of a replicated source and a replicated endpoint of the original net.

4. The method of claim 1, wherein unfolding the original path includes:
    generating a new endpoint net for a replicated path if the new endpoint net has not already been generated for a previous path;
    generating a new start point net; and
    replicating zero or more gates in the original path for the replicated path.

5. The method of claim 4, wherein replicating zero or more gates in the original path for the replicated path includes:
    determining, for each output of each replicated gate, if a sink of an output of the replicated gate is the new endpoint net; and
    connecting the replicated gate to the endpoint net if the sink of the output of the replicated gate is the new endpoint net.

6. The method of claim 4, wherein replicating zero or more gates in the original path for the replicated path includes:
    determining if a replicated sink gate for the original path exists;
    determining if a replicated output net for the original path exists; and
    connecting output of the zero or more replicated gates to the replicated output net, if the replicated sink gate for the original path exists and the replicated output net for the original path exists.

7. The method of claim 6, wherein if a replicated sink gate for the original path does exist, and a replicated output net for the original path does not exist, an output net of the original gate in the original path is replicated and the replicated gate is connected to the replicated output net of the original gate.

8. The method of claim 4, wherein replicating zero or more gates in the original path for the replicated path includes:
    determining, for each input of the original gate, if a source of an input of the original gate is the new start point net; and
    connecting the replicated gate to the new start point net if the source of the input to the original gate is the new start point net.

9. The method of claim 4, wherein replicating zero or more gates in the original path for the replicated path includes:
    determining if a replicated input net for the original path exists; and
    connecting an input of the replicated gate to the replicated input net if the replicated input net exists.

10. The method of claim 1, wherein identifying an original path in the integrated circuit design requiring unfolding includes at least one of identifying paths in the integrated circuit design in which a common source drives more than one path and identifying asynchronous interface paths.

11. A computer program product comprising a computer readable medium comprising instructions, wherein the instructions, when executed by a computing device, cause the computing device to execute a method for modeling an operation of an integrated circuit design, the instructions comprising:
    first instructions for receiving data representing the integrated circuit design;
    second instructions for identifying an original path in the integrated circuit design requiring unfolding, wherein the original path starts at a source and ends at two or more sinks;
    third instructions for unfolding the original path such that one or more new nets are provided, wherein each of the one or more new nets is driven from a differently delayed source from that of the original path; and
    fourth instructions for modeling an operation of the integrated circuit design using the original net and the one or more new nets such that each of the original path and the one or more new nets provides a different propagation delay at the two or more sinks and a transitioning value has differing arrival times at the two or more sinks.

12. The computer program product of claim 11, further comprising:
    fifth instructions for determining if a logic gate in the original path requires replication; and
    sixth instructions for replicating the logic gate if the logic gate needs to be replicated.

13. The computer program product of claim 11, wherein the one or more new nets are added to a netlist for the integrated circuit design and wherein the one or more new nets are connected to one or more of a replicated source and a replicated endpoint of the original net.

14. The computer program product of claim 11, wherein the third instructions for unfolding an original net in the original path include:
    instructions for generating a new endpoint net for a replicated path if the new endpoint net has not already been generated for a previous path;
    instructions for generating a new start point net; and
    instructions for replicating zero or more gates in the original path for the replicated path.

15. The computer program product of claim 14, wherein the instructions for replicating zero or more gates in the original path for the replicated path include:
    instructions for determining, for each output of each replicated gate, if a sink of an output of the replicated gate is the new endpoint net; and
    instructions for connecting the replicated gate to the new endpoint net if the sink of the output of the replicated gate is the new endpoint net.

16. The computer program product of claim 14, wherein the instructions for replicating zero or more gates in the original path for the replicated path include:
    instructions for determining if a replicated sink gate for the original path exists;
    instructions for determining if a replicated output net for the original path exists; and
    instructions for connecting output of the zero or more replicated gates to the replicated output net, if the replicated sink gate for the original path exists and the replicated output net for the original path exists.

17. The computer program product of claim 16, wherein if a replicated sink gate for the original path does exist, and a replicated output net for the original path does not exist an output net of the original gate in the original path is replicated and the replicated gate is connected to the replicated output net of the original gate.

18. The computer program product of claim 14, wherein the instructions for replicating zero or more gates in the original path for the replicated path include:
   instructions for determining, for each input of the original gate, if a source of an input of the original gate is the new start point net; and
   instructions for connecting the replicated gate to the new start point net if the source of the input to the original gate is the new start point net.

19. The computer program product of claim 14, wherein the instructions for replicating zero or more gates in the original path for the replicated path includes:
   instructions for determining if a replicated input net for the original path exists; and
   instructions for connecting an input of the replicated gate to the replicated input net if the replicated input net exists.

20. A system for modeling an operation of an integrated circuit design, comprising:
   means for receiving data representing the integrated circuit design;
   means for identifying an original path in the integrated circuit design requiring unfolding, wherein the original Dath starts at a source and ends at two or more sinks;
   means for unfolding the original path such that one or more new nets are provided, wherein each of the one or more new nets is driven from a differently delayed source from that of the original path; and
   means for modeling an operation of the integrated circuit design using the original net and the one or more new nets such that each of the original path and the one or more new nets provides a different propagation delay at the two or more sinks and a transitioning value has differing arrival times at the two or more sinks.

* * * * *